(12) United States Patent
Takashino

(10) Patent No.: US 6,661,040 B2
(45) Date of Patent: Dec. 9, 2003

(54) SEMICONDUCTOR DEVICE WITH INSULATING GATE SURROUNDED BY IMPURITY LAYERS

(75) Inventor: Hiroyuki Takashino, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/137,289

(22) Filed: May 3, 2002

(65) Prior Publication Data

US 2003/0011007 A1 Jan. 16, 2003

(30) Foreign Application Priority Data

Jul. 11, 2001 (JP) ........................................ 2001-210781

(51) Int. Cl.[7] .......................... H01L 27/10; H01L 29/792
(52) U.S. Cl. ........................................ 257/202; 257/324
(58) Field of Search ................................. 257/211, 324, 257/202

(56) References Cited

U.S. PATENT DOCUMENTS

| 4,737,837 A | * | 4/1988 | Lee ............................. 326/102 |
| 5,331,192 A | * | 7/1994 | Kudoh ......................... 257/368 |
| 5,436,481 A | * | 7/1995 | Egawa et al. ................ 257/324 |
| 5,808,330 A | * | 9/1998 | Rostoker et al. ............. 257/208 |

FOREIGN PATENT DOCUMENTS

| JP | 5-326884 | 12/1993 |
| JP | 7-193151 | 7/1995 |
| WO | WO-00/60665 | * 10/2000 |

OTHER PUBLICATIONS

Boaz Eitan, et al., "Can NROM, a 2 Bit, Trapping Storage NVM Cell, Give a Real Challenge to Floating Gate Cells?", Extended Abstracts of the 1999 International Conference on Solid State Devices and Materials, Tokyo, 1999, C–11–1, pp. 522–524.

* cited by examiner

Primary Examiner—Wael Fahmy
Assistant Examiner—Howard Weiss
(74) Attorney, Agent, or Firm—Oblon, Spivak, McClelland, Maier & Neustadt, P.C.

(57) ABSTRACT

A plurality of ONO films are provided in a matrix on a substrate surface. Gate electrodes are provided on each of the ONO films. Further provided in the substrate surface are n-type impurity layers and p-type impurity layers. Each of the p-type impurity layers is arranged between the n-type impurity layers. In a plan view of the substrate surface, the n-type impurity layers and the p-type impurity layers are arranged to surround the respective ONO films and the gate electrodes.

6 Claims, 13 Drawing Sheets

F I G . 1
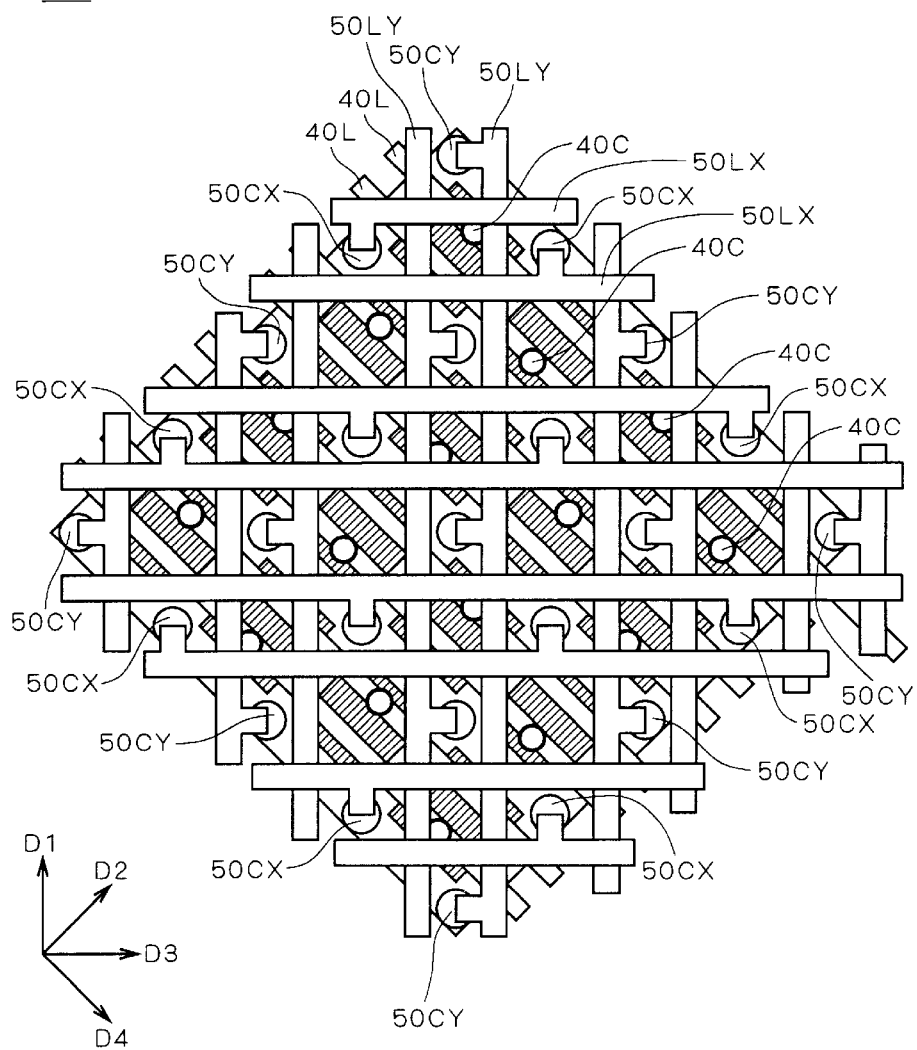

F I G . 17
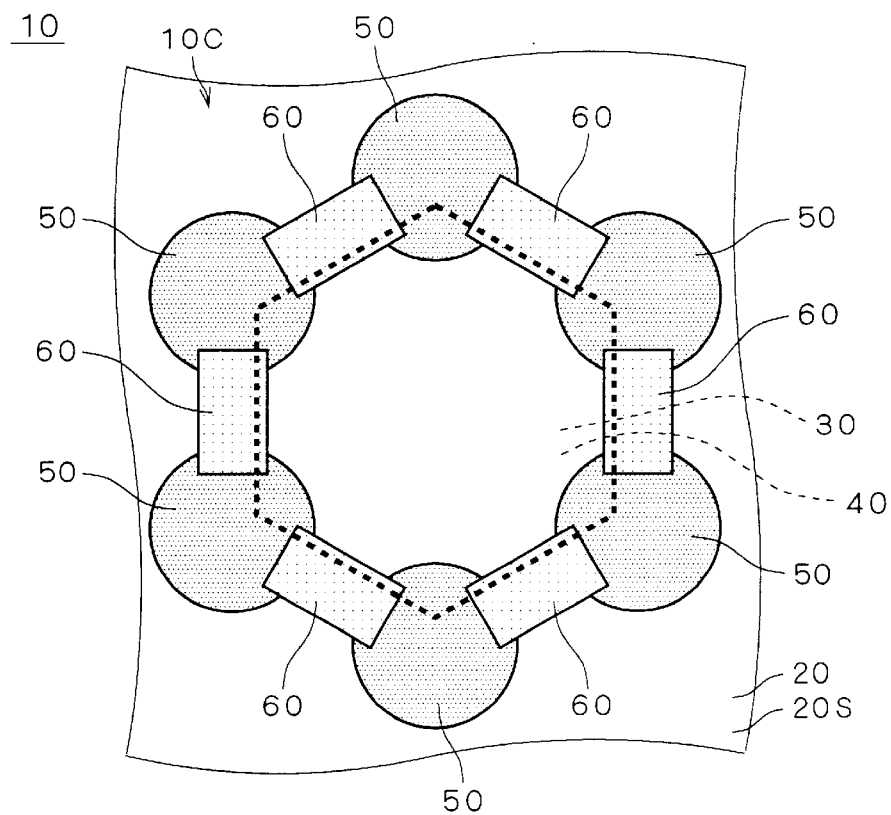

SEMICONDUCTOR DEVICE WITH INSULATING GATE SURROUNDED BY IMPURITY LAYERS

BACKGROUND OF THE INVENTION

1. Field of the Invention

The present invention relates to a technique for realizing high level of integration and increase in capacity of a semiconductor memory device.

2. Description of the Background Art

FIG. 18 is a sectional view illustrating the structure of one cell of a semiconductor memory device 10P in the background art. The semiconductor memory device 10P is known as an "NROM", whose description is given in "Extended Abstracts of the 1999 International Conference on Solid State Devices and Materials, 1999, pp. 522–524", for example.

The semiconductor memory device 10P includes a p-type silicon substrate 20P, an ONO film 30P (consisting of silicon oxide film 30AP/silicon nitride film 30BP/silicon oxide film 30CP) and a gate electrode 40P. The ONO film 30P and the gate electrode 40P are sequentially provided in this order on the p-type silicon substrate 20P. The surface of the silicon substrate 20P includes a pair of n-type layers 51P and 52P provided therein. These n-type layers 51P and 52P are arranged in the vicinity of the ends of the ONO film 30P. In the semiconductor memory device 10P according to the background art, the ONO film 30P, the gate electrode 40P and the two n-type layers 51P, 52P constitute a cell 10CP.

In the semiconductor memory device 10P, bit judgment is performed on the basis of whether a portion 30B1P in the nitride film 30BP defined in the vicinity of the n-type layer 51P includes electrons and further, on the basis of whether a portion 30B2P in the nitride film 30BP defined in the vicinity of the n-type layer 52P includes electrons. That is, the cell 10CP of the semiconductor memory device 10P serves as a device for storing 2 bits of information.

More particularly, when a positive voltage is applied to the gate electrode 40P using the n-type layer 51P as a source and using the n-type layer 52P as a drain, a gate threshold voltage of a driving current changes on the basis of whether the portion 30B1P in the nitride film 30BP includes electrons. Conversely, when a positive voltage is applied to the gate electrode 40P using the n-type layer 51P as a drain and using the n-type layer 52P as a source, a gate threshold voltage of a driving current changes on the basis of whether the portion 30B2P in the nitride film 30BP includes electrons.

SUMMARY OF THE INVENTION

In response to the need in recent years for higher level of integration and increase in capacity to a greater degree of a semiconductor memory device, it is an object of the present invention to provide a semiconductor memory device realizing higher level of integration and increase in capacity to a greater degree as compared with the semiconductor memory device 10P in the background art.

According to the present invention, the semiconductor memory device includes a semiconductor substrate of a first conductivity type having a substrate surface, a first gate insulating film, a first gate electrode and at least four impurity layers each being of a second conductivity type opposite to the first conductivity type. The first gate insulating film is provided on the substrate surface and capable of accumulating electric charges. The first gate electrode is provided on the substrate surface through the first gate insulating film. The at least four impurity layers are provided in the substrate surface to surround the first gate insulating film in a plan view of the substrate surface.

In the semiconductor memory device, in the plan view of the substrate surface, the at least four impurity layers form a plurality of first pairs and each of the plurality of first pairs includes impurity layers opposed to each other through the first gate insulating film. Each of the plurality of first pairs serves as a source/drain of a MISFET structure including the semiconductor substrate, the first gate insulating film and the first gate electrode.

In the semiconductor memory device, the semiconductor memory device includes a plurality of (or at least two) MISFET structures provided to each first gate insulating film and first gate electrode (namely, in one cell). Therefore, as compared with the semiconductor memory device in the background art including only one MISFET structure in one cell, the number of bits to be stored in one cell is increased. As a result, it is possible to realize higher level of integration and increase in capacity to a greater degree.

Preferably, the semiconductor memory device includes a second gate insulating film, a second gate electrode and at least two impurity layers each being of the second conductivity type. The second gate insulating film is provided on the substrate surface and capable of accumulating electric charges. The second gate electrode is provided on the substrate surface through the second gate insulating film. The at least two impurity layers are provided in the substrate surface to surround the second gate insulating film together with part of the at least four impurity layers in the plan view of the substrate surface.

In the semiconductor memory device, in the plan view of the substrate surface, the at least two impurity layers and the part of the at least four impurity layers form a plurality of second pairs and each of the plurality of second pairs includes impurity layers opposed to each other through the second gate insulating film. Each of the plurality of second pairs serves as a source/drain of a MISFET structure including the substrate surface, the second gate insulating film and the second gate electrode.

In the semiconductor memory device, the MISFET structure (or cell) (including the first gate insulating film and the first gate electrode) and the MISFET structure (or cell) (including the second gate insulating film and the second gate electrode) share part of at least four impurity layers. Therefore, as compared with the structure including the cells each having the at least four impurity layers, higher level of integration is realized.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 through 4 are plan views illustrating a semiconductor memory device according to a first preferred embodiment of the present invention;

FIG. 17 is a plan view illustrating an alternative structure of the semiconductor memory device according to the first preferred embodiment of the present invention.

DESCRIPTION OF THE PREFERRED EMBODIMENTS

<Preferred Embodiment>

FIG. 1 is a plan view illustrating a semiconductor memory device 10 according to the first preferred embodiment. For the convenience of description, plan views are prepared as FIG. 2 omitting bit lines 50LY, 50LX in FIG. 1 and as FIG. 3 further omitting word lines 40L in FIG. 2. Further, FIG. 4 is a plan view illustrating impurity layers provided in a semiconductor substrate (hereinafter may be referred to simply as "substrate") 20. In FIG. 4, ONO (oxide-nitride-oxide) films 30 are indicated by broken lines.

Figure 5:
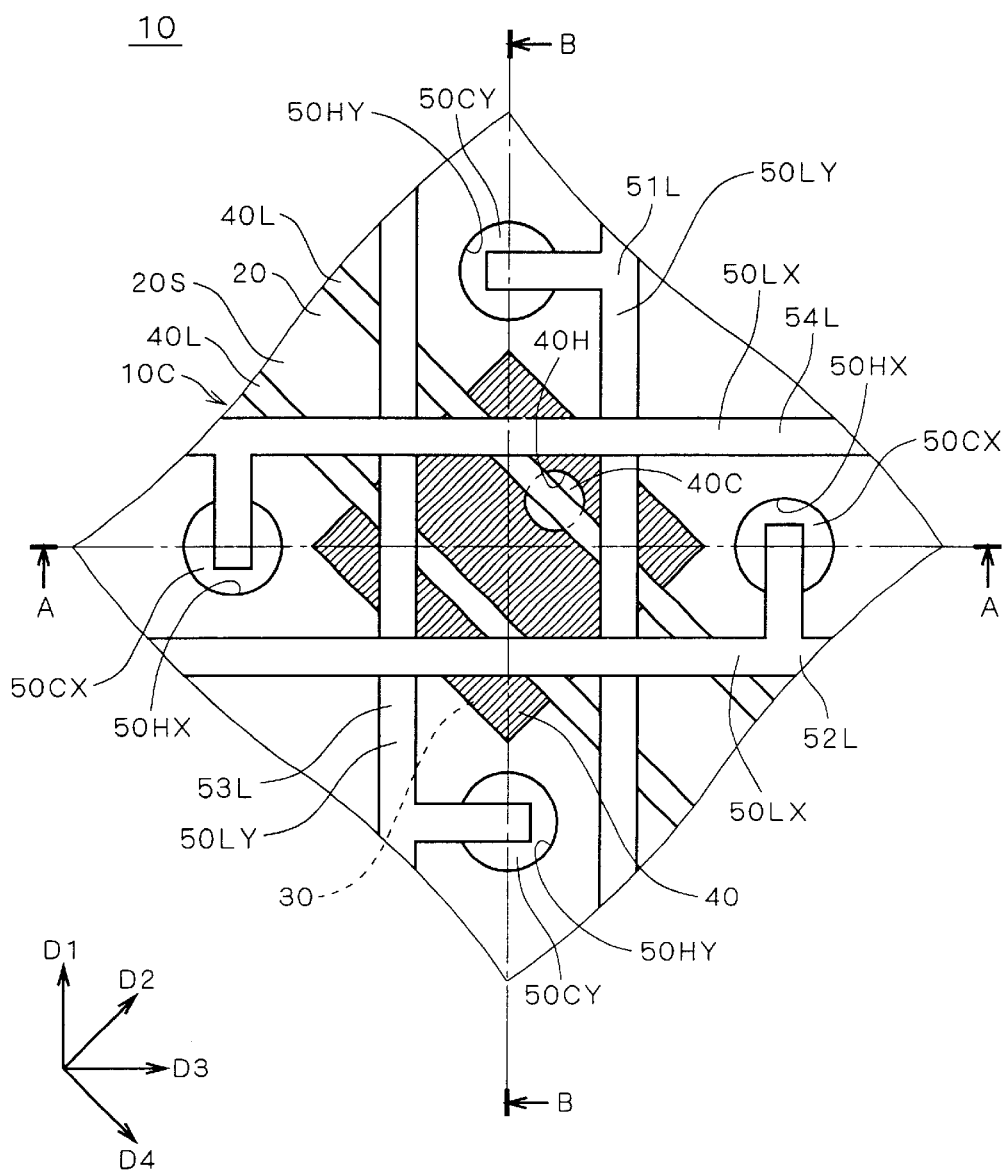
FIG. 5 is a plan view illustrating one cell of the semiconductor memory device according to the first preferred embodiment of the present invention.
Figure 6:
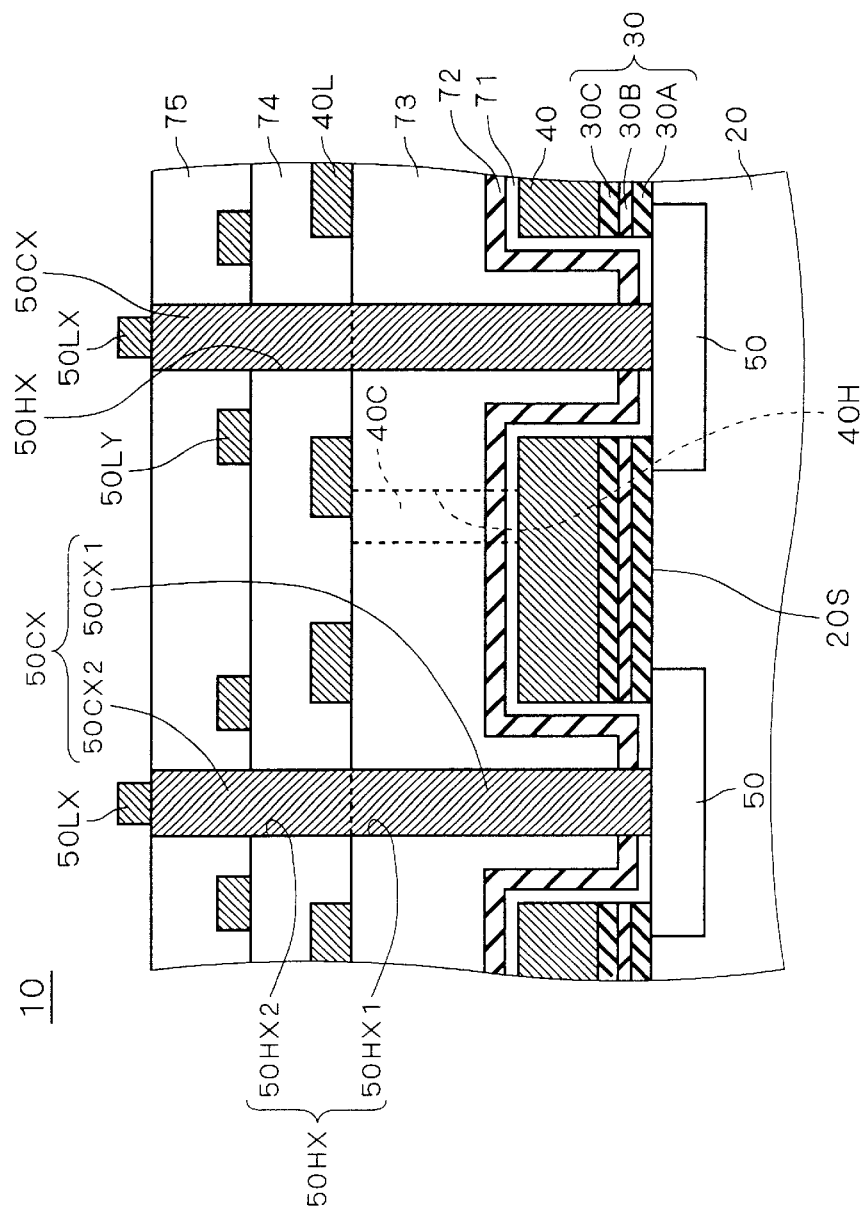
FIGS. 6 and 7 are sectional views illustrating the semiconductor memory device according to the first preferred embodiment of the present invention.
Figure 7:
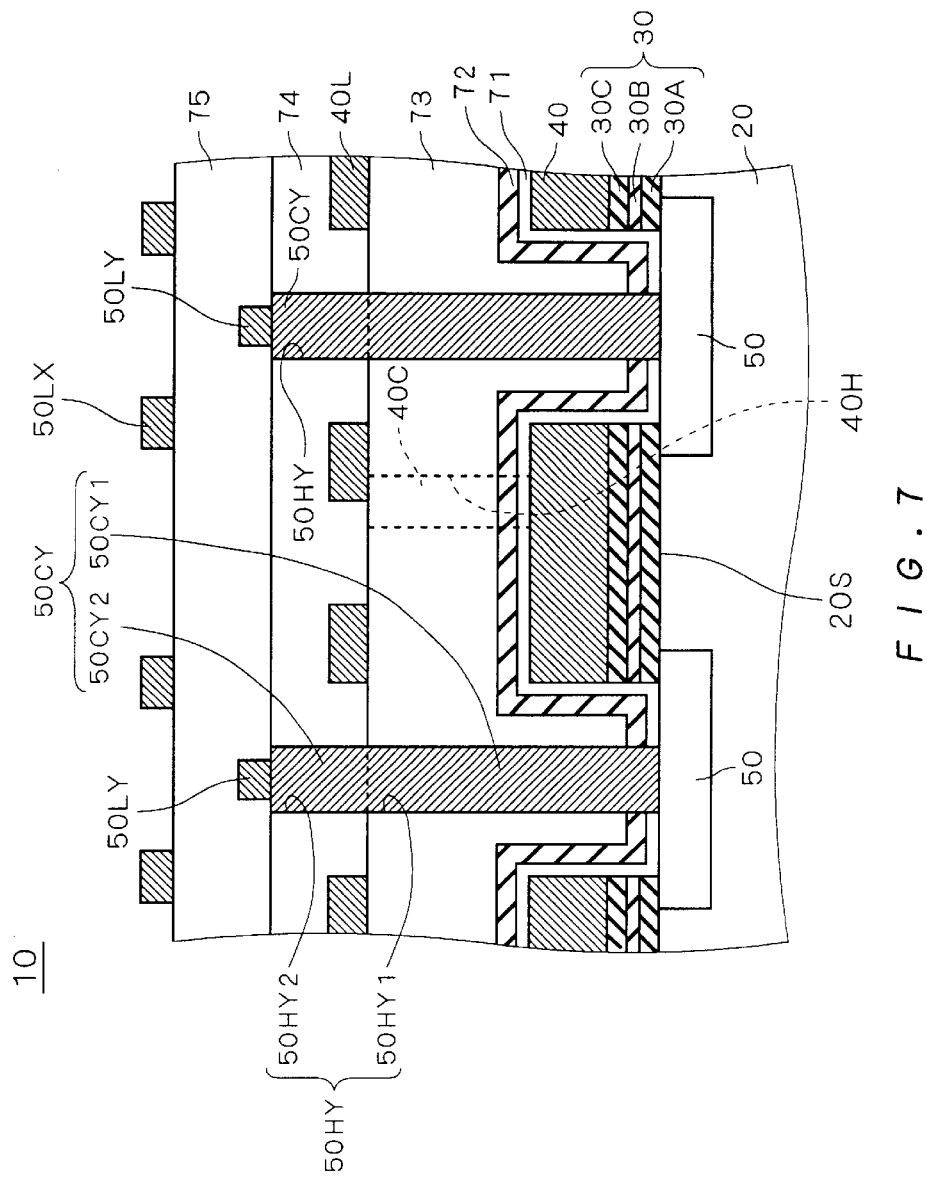

FIG. 5 is a plan view illustrating the structure of a cell 10C corresponding to one cell extracted from the semiconductor memory device 10 in FIG. 1. FIGS. 6 and 7 are views illustrating sections at lines A—A and B—B in FIG. 5, respectively.

The shapes of respective constituents of the semiconductor memory device 10 and the arrangement (layout) thereof are schematically illustrated in the plan views such as FIG. 1. For example, FIG. 1 conveniently illustrates contacts 40C arranged under the word lines 40L. In order to avoid complication, some of the constituents such as interlayer films 73, 74, 75 and a silicon nitride film 72 illustrated in FIG. 6, for example, are omitted from the plan views such as FIG. 1.

For the convenience of description, a first direction D1, a second direction D2, a third direction D3 and a fourth direction D4 are defined each in parallel with a surface 20S of a substrate 20 (hereinafter may be referred to simply as "substrate surface"). More particularly, the second direction D2, the third direction D3 and the fourth direction D4 are defined at the angles of 45 degrees, 90 degrees and 135 degrees, respectively, from the first direction D1.

The semiconductor memory device 10 comprises the substrate 20 of p-type (or of first conductivity type) made of silicon, the ONO films 30 each serving as a gate insulating film, gate electrodes 40, impurity layers 50 of n-type (or of second conductivity type) and p-type impurity layers (or first and second high concentration layers) 60.

More particularly, a plurality of ONO films 30 are arranged in a matrix and each spaced from one another on the substrate surface 20S. As an example, the following description will discuss a structure including four ONO films 30 arranged in the second and fourth directions D2 and D4, respectively, in a plan view of the substrate surface 20S (see FIGS. 1 through 4, for example). That is, the structure including 16 ONO films 30 arranged in a matrix of 4×4 will be discussed. According to this matrix arrangement, space 30W defined between the ONO films 30 has as a whole a mesh structure or lattice structure. In the following description, the ONO films 30 are defined as squares having respective sides parallel with one another in the second and fourth directions D2 and D4.

Each of the ONO films 30 includes a lower silicon oxide film 30A, a silicon nitride film 30B and an upper silicon oxide film 30C stacked in this order on the substrate surface 20S. Generally, a silicon nitride film has a characteristic of accumulating electric charges more easily than a silicon oxide film.

A silicon oxide film may also be referred to simply as oxide film hereinafter. Further, a lower silicon oxide film and an upper silicon oxide film may also be referred to simply as lower oxide film and upper oxide film, respectively. In addition, a silicon nitride film may also be referred to simply as nitride film.

The lower oxide film 30A and the upper oxide film 30C are defined to have thicknesses each ranging between 50 angstroms (=5 nm) and 150 angstroms. Each of these thicknesses is 100 angstroms, for example. The nitride film 30B is defined to have a thickness ranging between 20 and 150 angstroms. The thickness thereof is 40 angstroms, for example.

The gate electrodes 40 are arranged on the respective ONO films 30 to face the substrate 20 through the ONO films 30. That is, the gate electrodes 40 are provided on the substrate surface 20S through the ONO films 30. Each of the gate electrodes 40 is made of p-type polysilicon having a thickness ranging between 1000 and 4000 angstroms, for example. As the thickness of each gate electrode 40 is reduced to a greater degree, the capacity between the gate electrode 40 and contacts 50CX, 50CY which will be described later can be reduced to a larger extent.

As illustrated in FIG. 4, the n-type impurity layers 50 are provided in the substrate surface 20S having no contact thereamong. More particularly, in the plan view of the semiconductor surface 20S, each of the n-type impurity layers 50 is provided at the intersecting point of the mesh-structured space 30W defined between the ONO films 30. Each of the n-type impurity layers 50 overlaps the ends (corners) of four ONO films 30 arranged to surround this intersecting point and is in contact with the ends (corners) of these four ONO films 30. The impurity concentration of each n-type impurity layer 50 is on the order of $10^{21}$ cm$^{-3}$, for example.

As illustrated in FIG. 4, the p-type impurity layers 60 are provided in the substrate surface 20S having no contact thereamong. More particularly, each of the p-type impurity layers 60 is provided between the n-type impurity layers 50 arranged in the second and fourth directions D2 and D4, respectively, and is in contact with the n-type impurity layers 50. That is, the p-type impurity layers 60 are arranged to surround the ONO films 30 together with the n-type impurity layers 50. In the plan view of the substrate surface 20S, each of the p-type impurity layers 60 overlaps the ends (sides) of the ONO film 30 and is in contact with the ends (sides) of the ONO film 30. As each p-type impurity layer 60 serves as an element isolation layers, the conductive connection (short-circuit) between the adjacent n-type impurity layers 50 is prevented, thereby establishing reliable isolation between the n-type impurity layers 50.

Each p-type impurity layer 60 has an impurity concentration higher than that of the substrate 20. The impurity concentrations of the substrate 20 and the p-type impurity layer 60 are on the order of $10^{17}$ cm$^{-3}$ and $10^{20}$ cm$^{-3}$, respectively. The impurity concentration of the p-type impurity layer 60 is so defined that it reliably serves as an element isolation layer.

The semiconductor memory device 10 further includes an oxide film 71, a nitride film 72, the interlayer films 73, 74, 75, contact holes 40H, 50HX, 50HY, the contacts (also referred to as plugs) 40C, 50CX, 50CY, the word lines (or interconnect lines) 40L and the bit lines (or interconnect lines) 50LX, 50LY.

More particularly, the oxide film 71 and the nitride film 72 are stacked in this order to cover the substrate surface 20S, the ONO films 30 and the gate electrodes 40. The oxide film 71 is defined to have a thickness of 100 angstroms, for example. The nitride film 72 is defined to have a thickness ranging between 500 and 1000 angstroms, for example. The oxide film 71 and the nitride film 72 are provided along non-planarity of the substrate surface 20S defined by the substrate surface 20S, the ONO films 30 and the gate electrodes 40.

The interlayer film 73 is provided to cover the nitride film 72. The space 30W defined between the ONO films 30 and the gate electrodes 40 forming a lattice structure are filled with the interlayer film 73. The word lines 40L are provided on the interlayer film 73. The word lines 40L extend in the fourth direction D4. Two word lines 40L are arranged above each one of the gate electrode 40.

The contact holes 40H are formed to penetrate the interlayer film 73, the nitride film 72 and the oxide film 71. The contact holes 40H are filled with the contacts (conductive members) 40C. These contacts 40C each having contact with the respective gate electrodes 40 and the word lines 40L establish electrical connection between the gate electrodes 40 and the word lines 40L.

Figure 2:
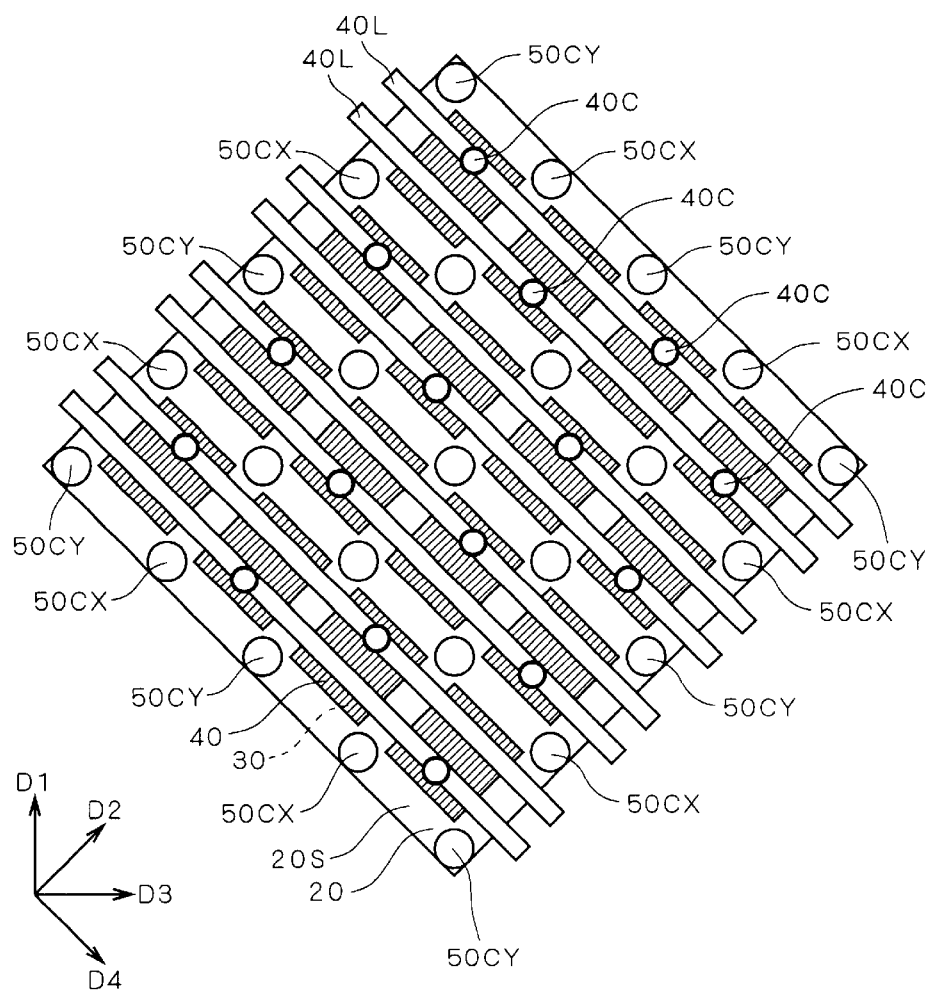
Figure 3:
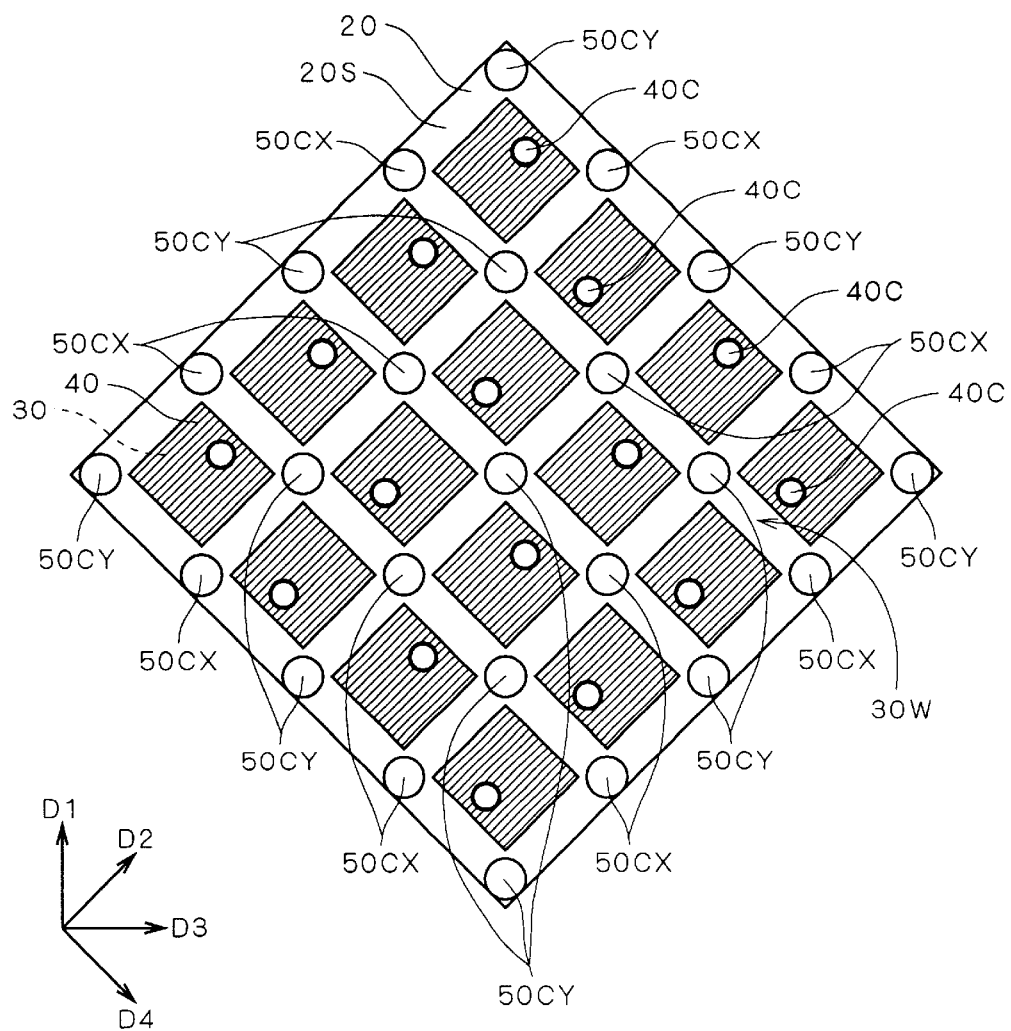
Figure 4:
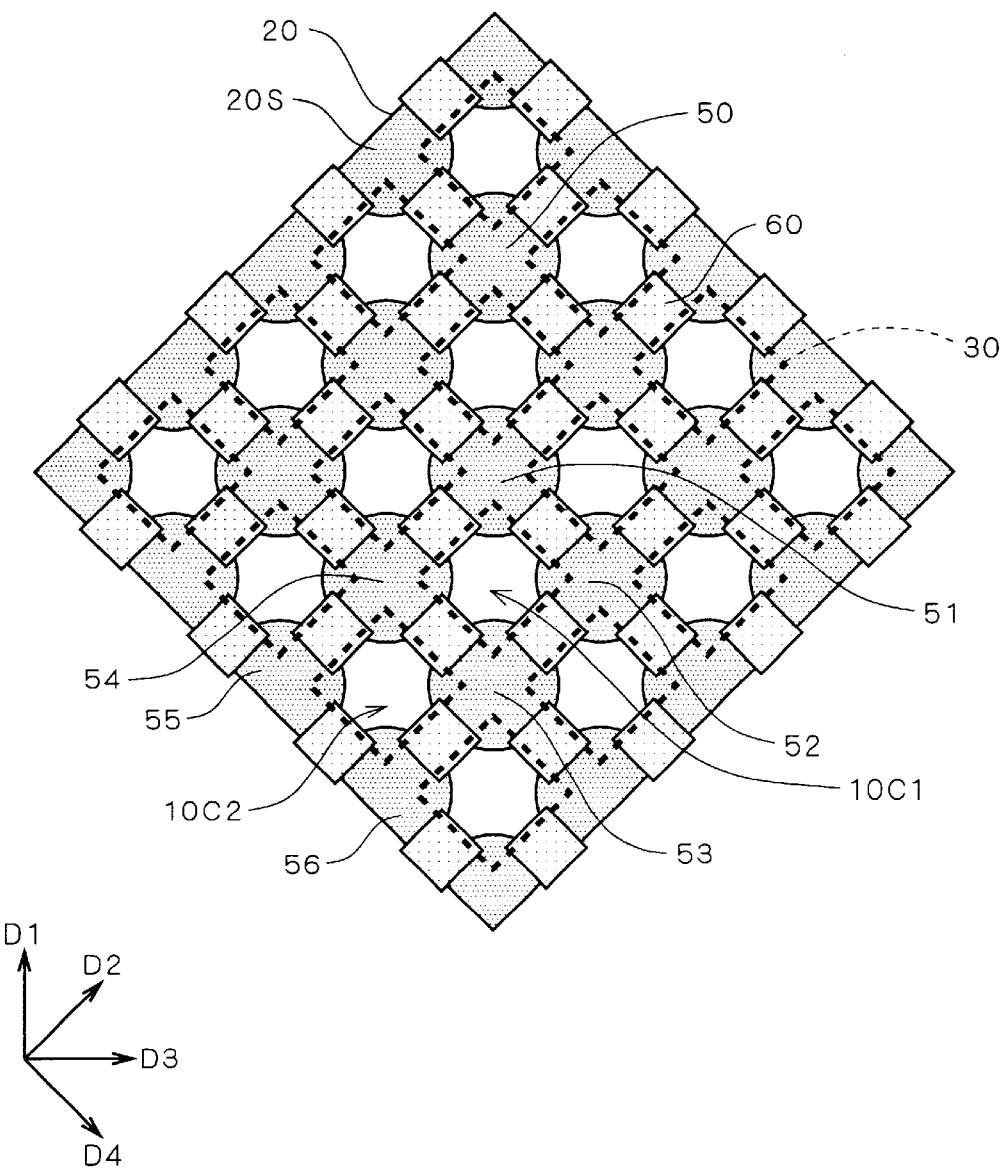

As illustrated in FIGS. 2 and 3, for example, the contacts 40C and the contact holes 40H on the respective gate electrodes 40 are arranged in straight lines in the second direction D2 and in zigzag lines in the fourth direction D4. In response to this arrangement in zigzag lines, each of the contact holes 40C is connected to either one of the two word lines 40L provided above each gate electrode 40. The contact holes 40C above the gate electrodes 40 adjacent to each other in the fourth direction D4 are connected to the different word lines 40L.

The interlayer film 74 is provided to cover the word lines 40L and the interlayer film 73. The contact holes 50HY are formed to penetrate the interlayer films 74, 73, the nitride film 72 and the oxide film 71 (see FIG. 7). Each of the contact holes 50HY consists of a contact hole 50HY1 penetrating the interlayer film 73, the nitride film 72, the oxide film 71 and a contact hole 50HY2 penetrating the interlayer film 74. The contact holes 50HY are filled with the contacts 50CY. Each of the contacts 50CY consists of a contact 50CY1 defined in the contact hole 50HY1 and a contact 50CY2 defined in the contact hole 50HY2.

As illustrated in FIG. 3, in the plan view of the semiconductor substrate 20S, the contact holes 50HY and the contacts 50CY are formed at the intersecting points of the mesh-structured space 30W defined between the ONO films 30. More particularly, the contact holes 50HY and the contacts 50CY are formed at every other intersecting point. The contact holes 50HY and the contacts 50CY lead to the substrate surface 20S, namely, to the n-type impurity layers 50.

The bit lines 50LY provided on the interlayer film 74 extend in the first direction D1. In the plan view of the substrate surface 20S, the bit lines 50LY are arranged on both sides of each column of the contacts 50CY in the first direction D1. Each contact 50CY sandwiched between the two bit lines 50LY on both sides thereof has contact with either one of these bit lines 50LY. The electrical connection is thereby established between the bit lines 50LY and the n-type impurity layers 50. The two contacts 50CY positioned adjacent to each other in the first direction D1 are connected to the different bit lines 50LY.

The interlayer film 75 is provided to cover the bit lines 50LY and the interlayer film 74. The contact holes 50HX are formed to penetrate the interlayer films 75, 74, 73, the nitride film 72 and the oxide film 71 (see FIG. 6). Each of the contact holes 50HX consists of a contact hole 50HX1 penetrating the interlayer film 73, the nitride film 72, the oxide film 71 and a contact hole 50HX2 penetrating the interlayer films 75, 74. The contact holes 50HX are filled with the contacts 50CX. Each of the contacts 50CX consists of a contact 50CX1 defined in the contact hole 50HX1 and a contact 50CX2 defined in the contact hole 50HX2.

As illustrated in FIG. 3, in the plan view of the substrate surface 20S, the contact holes 50HX and the contacts 50CX are formed at the intersecting points of the mesh-structured space 30W defined between the ONO films 30. More particularly, the contact holes 50HX and the contacts 50CX are formed at every other intersecting point. The contact holes 50HX and the contacts 50CX lead to the substrate surface 20S, namely, to the n-type impurity layers 50.

As can be seen from FIG. 3, the contact holes 50HX and the contact holes 50HY, namely, the contacts 50CX and the contacts 50CY are alternately arranged in the second and fourth directions D2 and D4.

The bit lines 50LX provided on the interlayer film 75 extend in the third direction D3. In the plan view of the substrate surface 20S, the bit lines 50LX are arranged on both sides of each column of the contacts 50CX in the third direction D3. Each contact 50CX sandwiched between the two bit lines 50LX on both sides thereof has contact with either one of these bit lines 50LX. The electrical connection is thereby established between the bit lines 50LX and the n-type impurity layers 50. The two contacts 50CX positioned adjacent to each other in the third direction D3 are connected to the different bit lines 50LX.

In the semiconductor memory device 10 having the foregoing structure, each one of the cells 10C includes one ONO film 30, one gate electrode 40 and four n-type impurity layers 50 surrounding the ONO film 30 and the gate electrode 40. As illustrated in FIG. 4, the four n-type impurity layers 50 surrounding the ONO film (or first gate insulating film) 30 and the gate electrode (or first gate electrode) 40, each included in an arbitrary cell 10C1, are also referred to as n-type impurity layers 51, 52, 53 and 54 in a clockwise direction. The p-type impurity layers 60 surrounding the cell 10C1 serve as first high concentration layers.

More particularly, in the plan view of the substrate surface 20S, the cell 10C1 includes the n-type impurity layers 51, 53 forming a pair (alternatively referred to as first pair) and opposed to each other through the ONO film 30 and the gate electrode 40, and the n-type impurity layers 52, 54 forming a pair (alternatively referred to as first pair) and opposed to each other through the ONO film 30 and the gate electrode 40. Due to this, the cell 10C1 comprises a MISFET structure including the pair of the n-type impurity layers 51, 53 each serving as a source/drain, and a MISFET structure including the pair of the n-type impurity layers 52, 54 each serving as a source/drain. A line connecting the n-type impurity layers 51, 53 and a line connecting the n-type impurity layers 52, 54 intersect with each other. In other words, channel regions of both of the MISFET structures intersect with each other. Further, these MISFET structures share the substrate 20 and the ONO film 30.

The arbitrary cell 10C1 is therefore operable as follows. The bit lines 50LY and 50LX electrically connected to the n-type impurity layers 51 through 54 are also referred to as bit lines 51L, 52L, 53L and 54L (see FIG. 5).

First, in the cell 10C1, a positive voltage is applied to the word line 40L having electrical connection to the gate electrode 40. A positive voltage is also applied to the bit line 51L and the bit line 53L is grounded so that readout is allowed using the n-type impurity layer 51 having connection to the bit line 51L as a drain and using the n-type impurity layer 53 having connection to the bit line 53L as a source. When the bit line 51L is grounded and a positive voltage is applied to the bit line 53L, conversely, readout is also allowed using the n-type impurity layer 51 as a source and using the n-type impurity layer 53 as a drain.

Further, when the word line 40L and the bit line 52L respectively receive positive voltage applied thereto and the bit line 54L is grounded, readout is allowed using the n-type impurity layer 52 having connection to the bit line 52L as a drain and using the n-type impurity layer 54 having connection to the bit line 54L as a source. When the bit line 52L is grounded and a positive voltage is applied to the bit line 54L, conversely, readout is also allowed using the n-type impurity layer 52 as a source and using the n-type impurity layer 54 as a drain.

Figure 18:
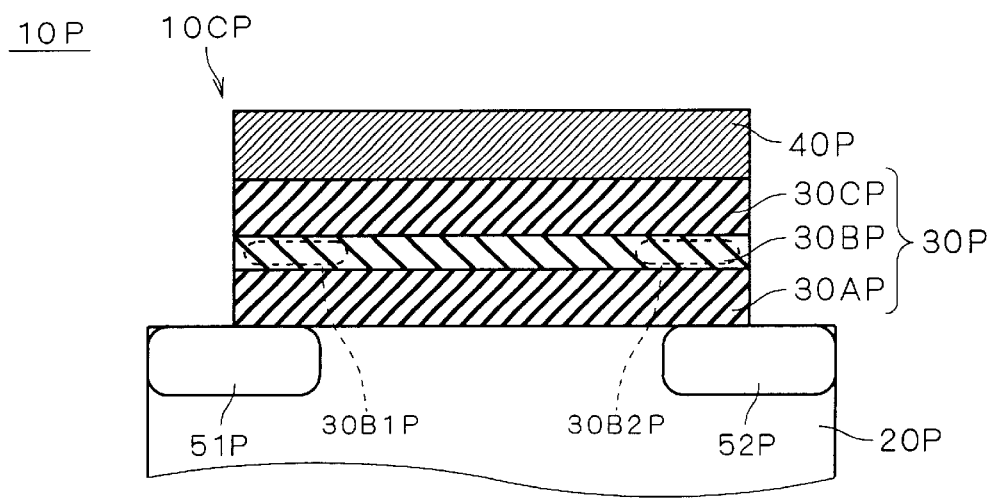
FIG. 18 is a sectional view illustrating a semiconductor memory device in the background art.

When a voltage higher than the voltage required for readout is applied between the gate electrode 40 and each of the n-type impurity layers 50 serving as a drain, electric charge (meant to be electrons here) can be trapped or accumulated in the portions of the nitride film 30B of the ONO film 30 defined in the vicinity of the n-type impurity layers 50 each serving as a drain (see the portions 30B1P and 30B2P of the nitride film 30BP illustrated in FIG. 18). That is, writing to the corresponding MISFET structures is realized.

Which one of the cells 10C in the semiconductor memory device 10 is to be selected is determined on the basis of the combination of the word line 40L and the bit lines 51L through 54L receiving voltage applied thereto.

As described above, the semiconductor memory device 10 is capable of storing 4 bits of information in one cell. Therefore, as compared with the semiconductor memory device 10P in the background art including only one MISFET structure in one cell, it is possible to realize higher level of integration and increase in capacity to a greater degree.

As illustrated in FIG. 4, in the semiconductor memory device 10, a cell 10C2 positioned adjacent to the arbitrary cell 10C1 in the second direction D2 includes the ONO film 30 (or second gate insulating film) and the gate electrode (or second gate electrode) 40 adjacent to part of the four n-type impurity layers 51 through 54 (n-type impurity layers 53 and 54 in the example of FIG. 4). Such ONO film 30 and the gate electrode 40 are surrounded by the n-type impurity layers 53 and 54 as part of the four n-type impurity layers 51 through 54 together with n-type impurity layers 55 and 56. That is, the cells 10C1 and 10C2 share the n-type impurity layers 53 and 54. The n-type impurity layers 54, 53, 56 and 55 surround the ONO film 30 and the gate electrode 40 in this order in a clockwise direction. The p-type impurity layers 60 positioned between the n-type impurity layers 53 and 56, between the n-type impurity layers 56 and 55 and between the n-type impurity layers 55 and 54, respectively, serve as second high concentration layers.

Similar to the cells 10C1 and 10C2 positioned adjacent to each other in the second direction D2, the cells 10C positioned adjacent to each other in the fourth direction D4 share two n-type impurity layers 50. Further, the cells 10C positioned adjacent to each other in the first and third directions D1 and D3, respectively, share one n-type impurity layer 50.

As described above, the cells 10C positioned adjacent to each other share the n-type impurity layer 50. Therefore, as compared with the structure consisting of the cells 10C each including four n-type impurity layers 50, higher level of integration is realized.

In the plan view of the substrate surface 20S, the cell 10C2 includes the n-type impurity layers 53, 55 forming a pair (alternatively referred to as second pair) and opposed to each other through the ONO film 30, and the n-type impurity layers 54, 56 forming a pair (alternatively referred to as second pair) and opposed to each other through the ONO film 30. Due to this, similar to the cell 10C1, the cell 10C2 comprises a MISFET structure including the pair of the n-type impurity layers 53, 55 each serving as a source/drain, and a MISFET structure including the pair of the n-type impurity layers 54, 56 each serving as a source/drain.

Next, a method of manufacturing the semiconductor memory device 10 will be described in reference to plan views/sectional views in FIGS. 8 through 16 with further reference to FIGS. 1 through 7 already described.

Figure 8:
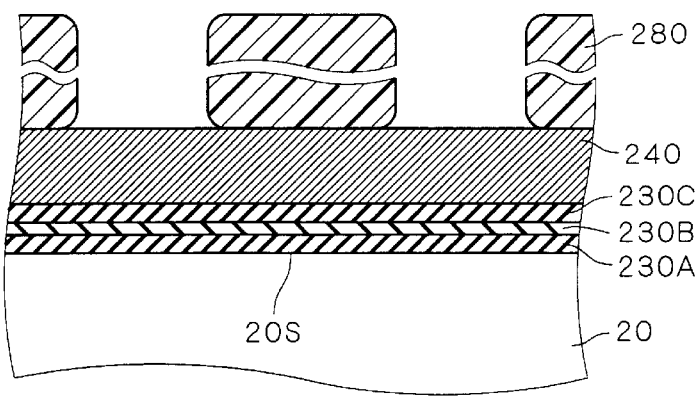
FIG. 8 is a sectional view illustrating a method of manufacturing the semiconductor memory device according to the first preferred embodiment of the present invention.
Figure 9:
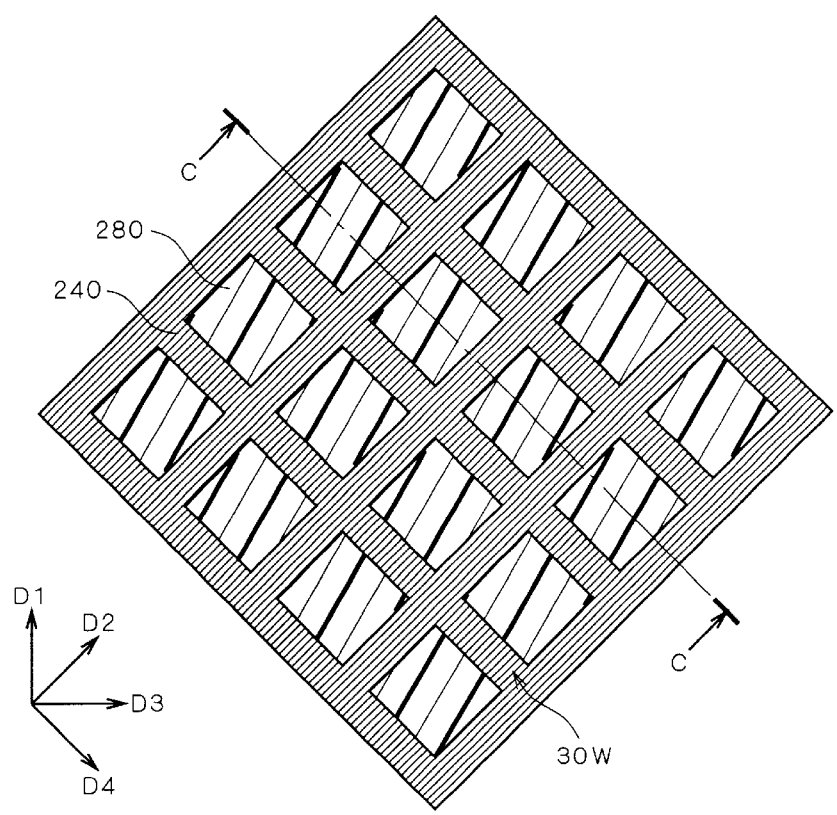
FIG. 9 is a plan view illustrating the method of manufacturing the semiconductor memory device according to the first preferred embodiment of the present invention.
Figure 10:
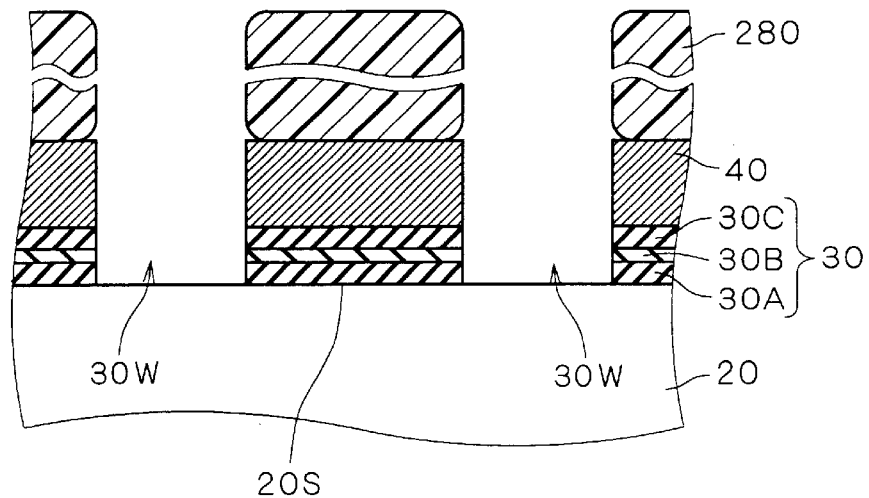
FIGS. 10 and 11 are sectional views illustrating the method of manufacturing the semiconductor memory device according to the first preferred embodiment of the present invention.

As illustrated in FIG. 8, an oxide film 230A is provided on the surface 20S of the substrate 20 by low temperature oxidation. This oxidation is performed at a temperature of about 800° C., for example. Next, a nitride film 230B and an oxide film 230C are deposited in this order on the oxide film 230A. Thereafter a polysilicon film 240 is provided on the oxide film 230C and n-type impurities such as phosphorus are implanted into the polysilicon film 240. Also formed on the polysilicon film 240 is a photoresist 280 which is patterned in a matrix as illustrated in FIG. 9 to be in conformity with the configuration of the ONO films 30 and the gate electrodes 40 (see FIG. 3, for example). Here, FIG. 8 is a view partially illustrating a cross section at a line C—C in FIG. 9.

Then, anisotropic etching is performed on the polysilicon film 240 using the patterned photoresist 280 as a mask. The oxide film 230C, the nitride film 230B and the oxide film 230A are also subjected to anisotropic etching. After these etching steps, the gate electrodes 40 are formed from the polysilicon film 240. Further, the upper oxide film 30C, the nitride film 30B and the lower oxide film 30A of each ONO film 30 are formed from the oxide film 230C, the nitride film 230B and the oxide film 230A, respectively.

Figure 11:
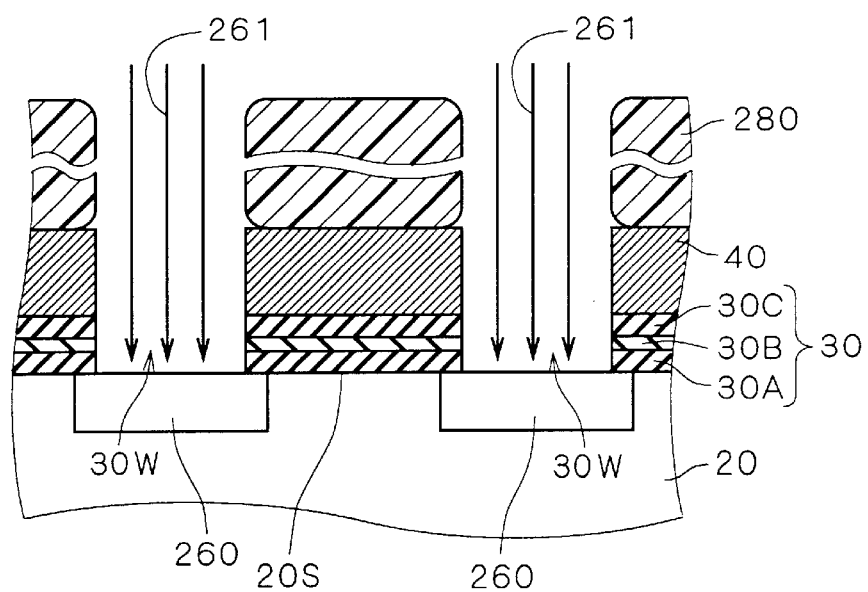
Figure 12:
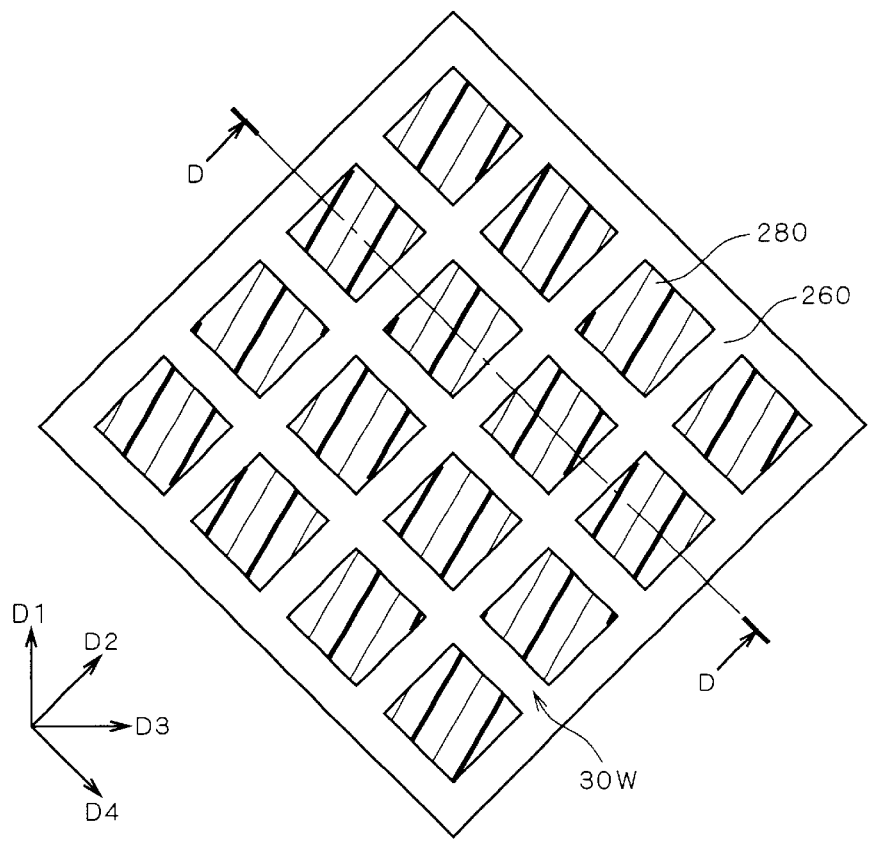
FIG. 12 is a plan view illustrating the method of manufacturing the semiconductor memory device according to the first preferred embodiment of the present invention.

Next, p-type impurities 261 such as boron are implanted into the substrate surface 20S using the patterned photoresist 280 as a mask as illustrated in FIG. 11. The implant dose of the p-type impurities 261 is set to range between $1 \times 10^{14}$ and $1 \times 10^{15}$ cm$^{-2}$, for example. This implantation creates a p-type impurity layer 260 in the substrate surface 20S each having an impurity concentration higher than that of the substrate 20 as illustrated in FIGS. 11 and 12. Here, FIG. 11 is a view partially illustrating a cross section at a line D—D in FIG. 12. During implantation of the impurities 261 and/or RTA step which will be described later, the p-type impurities 261 are diffused under the ONO films 30 so that connection is established between the p-type impurity layer 260 and the ends of the ONO films 30. Thereafter the photoresist 280 is removed.

The next step is RTA (rapid thermal annealing) at a temperature of about 1000° C., for example. The n-type impurities in the gate electrodes 40 and the p-type impurities 261 in the p-type impurity layer 260 are thereby activated.

Figure 13:
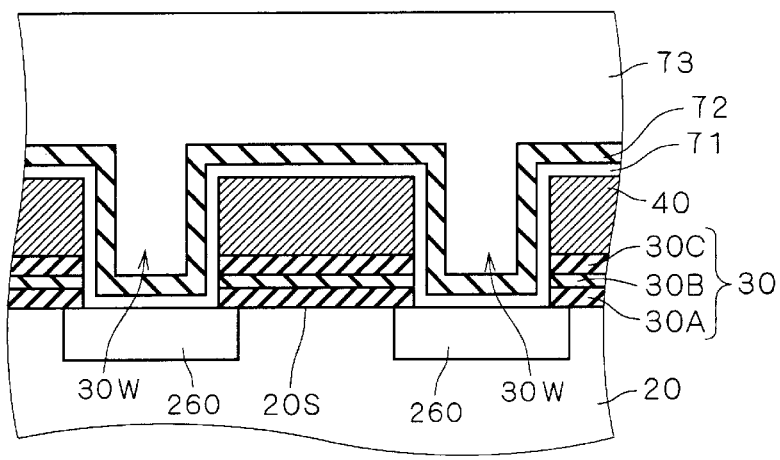
FIG. 13 is a sectional view illustrating the method of manufacturing the semiconductor memory device according to the first preferred embodiment of the present invention.
Figure 14:
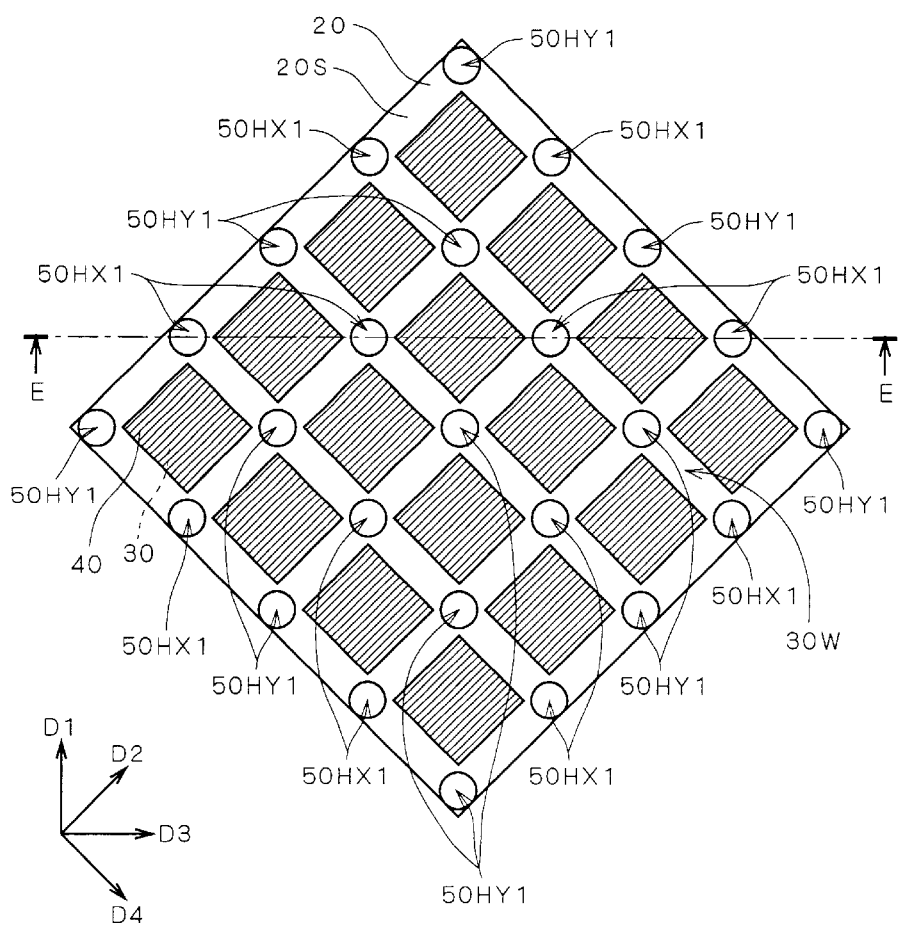
FIG. 14 is a plan view illustrating the method of manufacturing the semiconductor memory device according to the first preferred embodiment of the present invention.
Figure 15:
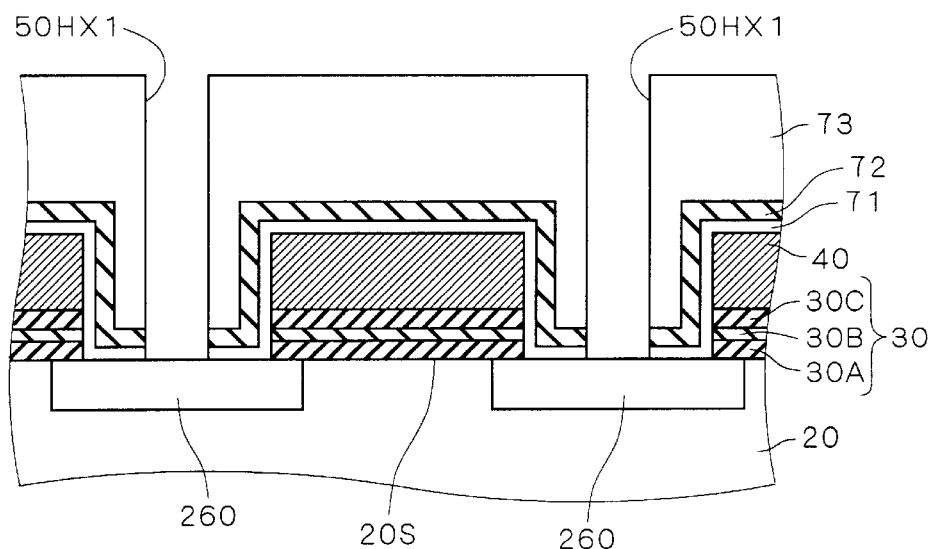
FIGS. 15 and 16 are sectional views illustrating the method of manufacturing the semiconductor memory device according to the first preferred embodiment of the present invention.

The oxide film 71, the nitride film 72 and the interlayer film 73 are then provided in this order to cover the gate electrodes 40, the ONO films 30 and the substrate surface 20S as illustrated in FIG. 13. Thereafter etching is performed to form the contact holes 50HX1 and 50HY1 to penetrate the interlayer film 73, the nitride film 72 and the oxide film 71, leading to the substrate surface 20S. Here, FIG. 15 is a view partially illustrating a cross section at a line E—E in FIG. 14. The gate electrodes 40 are covered with the nitride film 72. Therefore, even when the contact holes 50HX1 and 50HY1 are not provided in their proper positions due to deviation of an etching mask from its proper position, for example, the gate electrodes 40 can be prevented from being etched.

Figure 16:
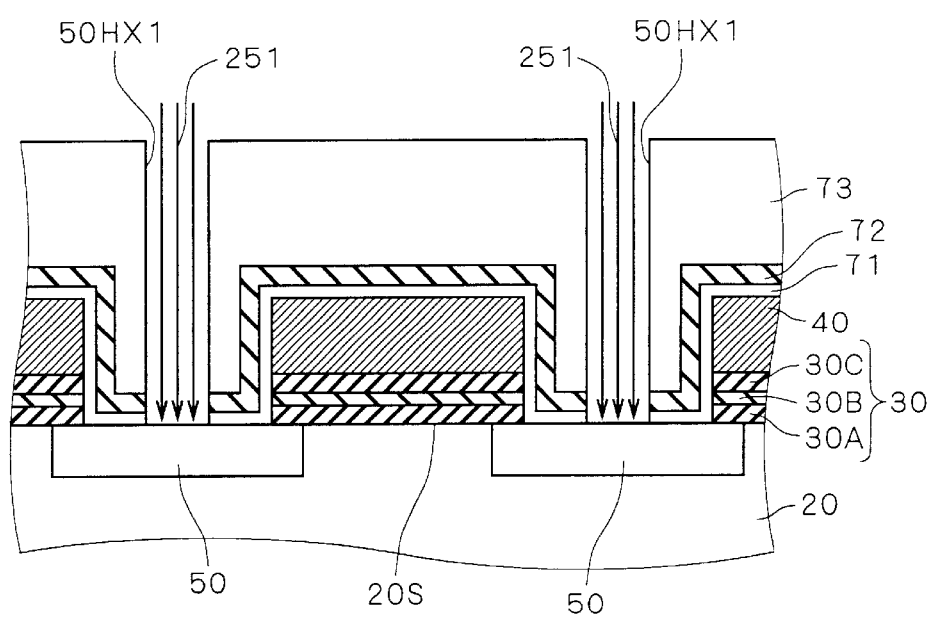

Subsequent to the above, n-type impurities 251 such as arsenic are implanted into the substrate surface 20S and more particularly, into the p-type impurity layer 260 (see FIG. 15, for example) using the interlayer film 73 as a mask as illustrated in FIG. 16. The n-type impurities 251 are thereby implanted into the substrate surface 20S through the contact holes 50HX1 and 50HY1 to form the n-type impurity layers 50. The implant dose of the n-type impurities 251 is set to be on the order of $10^{15}$ cm$^{-2}$. The implanted n-type impurities 251 are activated by RTA at a temperature ranging between 900° C. and 1000° C., for example.

Parts of the p-type impurity layer 260 described above (see FIGS. 11 and 12, for example) which remain after formation of the n-type impurity layers 50 are to serve as the p-type impurity layers 60. For this reason, the implant dose of the p-type impurities 261 mentioned above is so set that parts of the p-type impurity layer 260, namely, the p-type impurity layers 60, still remains after the n-type impurity layers 50 are formed.

Thereafter the contact 50CX1 and 50CY1 are formed in the contact holes 50HX1 and 50HY1, respectively.

Next, the contact holes 40H are formed to penetrate the interlayer film 73, the nitride film 72 and the oxide film 71, leading to lead the gate electrodes 40. The contacts 40C are provided in the contact holes 40H and the word lines 40L are provided on the interlayer film 73.

The interlayer film 74 is then provided to cover the word lines 40L and the interlayer film 73. Further, the contact holes 50HY2 are formed in the interlayer film 74. The contact holes 50HY are thereby defined each including the two contact holes, namely, the contact holes 50HY1 and 50HY2. Subsequently, the contacts 50CY2 are formed in the contact holes 50HY2. The contacts 50CY are thereby defined each including the two contacts, namely, the contacts 50CY1 and 50CY2. Thereafter the bit lines 50LY are provided to be connected to the contacts 50CY2, namely, to the contacts 50CY.

Next, the interlayer film 75 is provided to cover the bit lines 50LY and the interlayer film 74. Further, the contact holes 50HX2 are formed in the interlayer film 75. The contact holes 50HX are thereby defined each including the two contact holes, namely, the contact holes 50HX1 and 50HX2. Subsequently, the contacts 50CX2 are formed in the contact holes 50HX2. The contacts 50CX are thereby defined each including the two contacts, namely, the contacts 50CX1 and 50CX2. Thereafter the bit lines 50LX are provided to be connected to the contacts 50CX2, namely, to the contacts 50CX.

Following the steps described above, the semiconductor memory device 10 reaches completion (see FIGS. 1, 6 and 7).

As illustrated in the schematic plan view (layout diagram) in FIG. 17, in the plan view of the substrate surface 20S, the shape of each ONO film 30 and the gate electrode 40 may be hexagon. When each ONO film 30 and the gate electrode 40 have such hexagonal shape, the n-type impurity layers 50 are arranged near each corner of the hexagon and the p-type impurity layers 60 are arranged near each side of the hexagon. Therefore, the ONO film 30 and the gate electrode 40 are surrounded by the n-type impurity layers 50 and the p-type impurity layers 60 alternately arranged. According to this arrangement, it results that one cell 10C is a structure in the plan view of the substrate surface 20S including three pairs each formed of the n-type impurity layers 50 positioned opposed to each other through the ONO film 30 and the gate electrode 40. In other words, one cell 10C includes three MISFET structures and therefore, is capable of storing 6 bits of information.

That is, when an N number of pairs are given each formed of the n-type impurity layers 50 opposed to each other through the ONO film 30 and the gate electrode 40, an N number of MISFET structures can be provided to one cell 10C. As a result, N bits of information can be stored in one cell 10C.

Alternatively, in the plan view of the substrate surface 20S, each ONO film 30 and the gate electrode 40 may be circular.

Instead of the ONO films 30, the insulating film having an alternative structure for accumulating electric charges is applicable as a gate insulating film. Such gate insulating film may have a two-layer structure including two films of the ONO film 30 (see FIG. 6, for example) except the lower oxide film 30A thereof or alternatively, it may have a two-layer structure including two films of the ONO film 30 except the upper oxide film 30C thereof. Further alternatively, the semiconductor memory device 10 may include both of the gate insulating film of these two-layer structures and the ONO film 30.

Each constituent of the semiconductor memory device 10 may be of the conductivity type (p-type or n-type) opposite to that described above. Further, the constituents such as the substrate 20 may be made of semiconductor material other than silicon. Still further, the order of stacking the word lines 40L and the bit lines 50LY, 50LX and the respective directions in which they extend are not limited to those described above.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory device, comprising:
   a semiconductor substrate of a first conductivity type having a substrate surface;
   a first gate insulating film provided on said substrate surface, said first gate insulating film being capable of accumulating electric charges;
   a first gate electrode provided on said substrate surface through said first gate insulating film; and
   at least four impurity layers each being of a second conductivity type opposite to said first conductivity type, said at least four impurity layers being provided in said substrate surface to surround said first gate insulating film in a plan view of said substrate surface, wherein in said plan view of said substrate surface, said at least four impurity layers form a plurality of first pairs, each of said plurality of first pairs including impurity layers opposed to each other through said first gate insulating film, and each of said plurality of first pairs serves as a source/drain of a MISFET structure including said semiconductor substrate, said first gate insulating film and said first gate electrode.

2. The semiconductor memory device according to claim 1, comprising:

a second gate insulating film provided on said substrate surface, said second gate insulating film being capable of accumulating electric charges;

a second gate electrode provided on said substrate surface through said second gate insulating film; and at least two impurity layers each being of said second conductivity type, said at least two impurity layers being provided in said substrate surface to surround said second gate insulating film together with part of said at least four impurity layers in said plan view of said substrate surface, wherein in said plan view of said substrate surface, said at least two impurity layers and said part of said at least four impurity layers form a plurality of second pairs, each of said plurality of second pairs including impurity layers opposed to each other through said second gate insulating film, and each of said plurality of second pairs serves as a source/drain of a MISFET structure including said substrate surface, said second gate insulating film and said second gate electrode.

3. The semiconductor memory device according to claim 2, further comprising:

first high concentration layers each being of said first conductivity type having an impurity concentration higher than that of said semiconductor substrate, said first high concentration layers being provided in said substrate surface to surround said second gate insulating film together with said part of said at least four impurity layers and said at least two impurity layers in said plan view of said substrate surface.

4. The semiconductor memory device according to claim 2, wherein said second gate insulating film includes a stacked structure made of a silicon oxide film and a silicon nitride film.

5. The semiconductor memory device according to claim 1, further comprising:

first high concentration layers each being of said first conductivity type having an impurity concentration higher than that of said semiconductor substrate, said first high concentration layers being provided in said substrate surface to surround said first gate insulating film together with said at least four impurity layers in said plan view of said substrate surface.

6. The semiconductor memory device according to claim 1, wherein said first gate insulating film includes a stacked structure made of a silicon oxide film and a silicon nitride film.

* * * * *